(12) United States Patent
Lawson et al.

(10) Patent No.: US 8,189,367 B1
(45) Date of Patent: May 29, 2012

(54) SINGLE EVENT UPSET HARDENED STATIC RANDOM ACCESS MEMORY CELL

(75) Inventors: David C. Lawson, Haymarket, VA (US); Jason F. Ross, Fairfax, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 1147 days.

(21) Appl. No.: 12/028,042

(22) Filed: Feb. 8, 2008

Related U.S. Application Data

(60) Provisional application No. 60/891,246, filed on Feb. 23, 2007.

(51) Int. Cl.
*G11C 11/00* (2006.01)

(52) U.S. Cl. .......... 365/154; 365/156; 365/149; 365/72; 365/188

(58) Field of Classification Search .................. 365/154, 365/156, 149, 72, 188
See application file for complete search history.

(56) References Cited

U.S. PATENT DOCUMENTS

| | | | |
|---|---|---|---|
| 4,130,892 A | | 12/1978 | Gunckel, II et al. |
| 4,725,981 A | * | 2/1988 | Rutledge ........................ 365/154 |
| 4,797,804 A | * | 1/1989 | Rockett, Jr. .................... 365/154 |
| 4,805,148 A | * | 2/1989 | Diehl-Nagle et al. ......... 365/154 |
| 4,809,226 A | * | 2/1989 | Ochoa, Jr. ...................... 365/156 |
| 4,833,644 A | * | 5/1989 | Plus et al. ........................ 365/53 |
| 4,912,675 A | * | 3/1990 | Blake et al. .................... 365/154 |
| 4,956,814 A | * | 9/1990 | Houston ......................... 365/154 |
| 5,018,102 A | * | 5/1991 | Houston ........................... 365/95 |
| 5,046,044 A | * | 9/1991 | Houston et al. ................ 365/156 |
| 5,053,848 A | * | 10/1991 | Houston et al. ................ 257/537 |
| 5,206,533 A | * | 4/1993 | Houston ......................... 257/393 |
| 5,307,142 A | * | 4/1994 | Corbett et al. ................. 365/156 |
| 5,310,694 A | * | 5/1994 | Houston ......................... 438/153 |
| 5,406,107 A | * | 4/1995 | Yamaguchi .................... 257/393 |
| 5,438,537 A | | 8/1995 | Sasaki |
| 5,525,923 A | * | 6/1996 | Bialas, Jr. et al. ............. 327/210 |

(Continued)

FOREIGN PATENT DOCUMENTS

EP 0432846 A1 6/1991

OTHER PUBLICATIONS

Zuleeg, R; Radiation Effects in GaAs FET Devices, Proceedings of the IEEE, vol. 77, No. 3, Mar. 1989, pp. 389-407, IEEE, New York, US.

(Continued)

*Primary Examiner* — Viet Q Nguyen
(74) *Attorney, Agent, or Firm* — Yudell Isidore Ng Russell; Antony Ng

(57) ABSTRACT

A single event upset (SEU) hardened memory cell to be utilized in static random access memories is disclosed. The SEU hardened memory cell includes a first transistor, a second transistor and a first resistor connected between a source of the first transistor and a drain of the second transistor. The SEU hardened memory cell also includes a third transistor, a fourth transistor and a second resistor connected between a source of the third transistor and a drain of the fourth transistor. The first resistor is also connected between a gate of the third transistor and the drain of the second transistor. The second resistor is also connected between a gate of the first transistor and the drain of the fourth transistor.

17 Claims, 4 Drawing Sheets

U.S. PATENT DOCUMENTS

| | | | |
|---|---|---|---|
| 5,572,460 A * | 11/1996 | Lien | 365/154 |
| 5,572,461 A * | 11/1996 | Gonzalez | 365/156 |
| 5,631,863 A * | 5/1997 | Fechner et al. | 365/156 |
| 5,801,396 A * | 9/1998 | Chan et al. | 257/65 |
| 5,905,290 A * | 5/1999 | Houston | 257/380 |
| 6,058,041 A * | 5/2000 | Golke et al. | 365/156 |
| 6,111,780 A * | 8/2000 | Bertin | 365/154 |
| 6,259,643 B1 * | 7/2001 | Li | 365/206 |
| 6,271,568 B1 * | 8/2001 | Woodruff et al. | 257/379 |
| 6,369,630 B1 * | 4/2002 | Rockett | 327/210 |
| 6,510,076 B1 * | 1/2003 | Lapadat et al. | 365/154 |
| 6,717,233 B1 * | 4/2004 | Haddad et al. | 257/536 |
| 6,822,894 B1 * | 11/2004 | Costello et al. | 365/154 |
| 6,847,543 B2 * | 1/2005 | Toyoda et al. | 365/154 |
| 6,975,532 B1 * | 12/2005 | Kosonocky et al. | 365/154 |
| 6,992,916 B2 * | 1/2006 | Liaw | 365/154 |
| 7,200,031 B2 * | 4/2007 | Liu et al. | 365/154 |
| 7,326,919 B2 * | 2/2008 | Atsuta et al. | 250/231.16 |
| 7,468,904 B2 * | 12/2008 | Lawson et al. | 365/154 |
| 7,719,887 B2 * | 5/2010 | Cannon et al. | 365/163 |
| 7,768,810 B2 * | 8/2010 | McCollum | 365/129 |
| 7,876,602 B2 * | 1/2011 | Lawrence et al. | 365/156 |
| 2002/0024098 A1 | 2/2002 | Eimori | |
| 2004/0140527 A1 | 7/2004 | Furuya et al. | |
| 2004/0165418 A1 | 8/2004 | Lesea | |
| 2006/0102957 A1 | 5/2006 | Liaw | |
| 2006/0133134 A1 | 6/2006 | Doyle et al. | |

OTHER PUBLICATIONS

Hsueh et al; CMOS/SOS High Soft-Error Threshold Memory Cell, IEEE Transactions on Nuclear Science, vol. NS-32, No. 6, Dec. 1985, pp. 4155-4158, IEEE, New York, US.

* cited by examiner

US 8,189,367 B1

SINGLE EVENT UPSET HARDENED STATIC RANDOM ACCESS MEMORY CELL

PRIORITY CLAIM

The present application claims priority under 35 U.S.C. §119(e)(1) to provisional application No. 60/891,246 filed on Feb. 23, 2007, the contents of which are incorporated herein by reference.

STATEMENT OF GOVERNMENT INTEREST

The present invention was made with United States Government support under contract number DTRA01.03.D.0007.0001 awarded by the Defense Threat Reduction Agency. The United States Government has certain rights in the present invention.

BACKGROUND OF THE INVENTION

1. Technical Field

The present invention relates to memory circuits in general, and in particular to static random access memory circuits. Still more particularly, the present invention relates to single event upset hardened static random access memory cells.

2. Description of Related Art

Static random access memories (SRAMs) that employ conventional six-transistor memory cells are commonly utilized in electronic devices for storing information. In certain environments, such as satellite orbital space, in which the level of radiation is relatively intense, SRAMs are more susceptible to single event upsets (SEUs) or soft errors.

Generally speaking, SEUs are caused by electron-hole pairs created by, and travelling along the path of, a single energetic particle as it passes through memory cells such as SRAM cells. A critical charge is the minimum amount of electrical charge required to change the logic state of an SRAM cell. Should the energetic particle generate a critical charge within a storage node of an SRAM cell, the logic state of the SRAM cell will be upset.

SUMMARY OF THE INVENTION

In accordance with a preferred embodiment of the present invention, a single event upset (SEU) hardened memory cell includes a first transistor, a second transistor and a first resistor connected between a source of the first transistor and a drain of the second transistor. The SEU hardened memory cell also includes a third transistor, a fourth transistor and a second resistor connected between a source of the third transistor and a drain of the fourth transistor. The first resistor is also connected between a gate of the third transistor and the drain of the second transistor. The second resistor is also connected between a gate of the first transistor and the drain of the fourth transistor.

In accordance with a preferred embodiment of the present invention, a single event upset (SEU) hardened memory cell includes a first inverter and a second inverter connected to each other in a cross-coupled manner. The SEU hardened memory cell also includes a first resistor, a second resistor and a capacitor. The first resistor is connected between the source of a first transistor and the drain of a second transistor within the first inverter. The second resistor is connected between the source of a first transistor and the drain of a second transistor within the second inverter.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
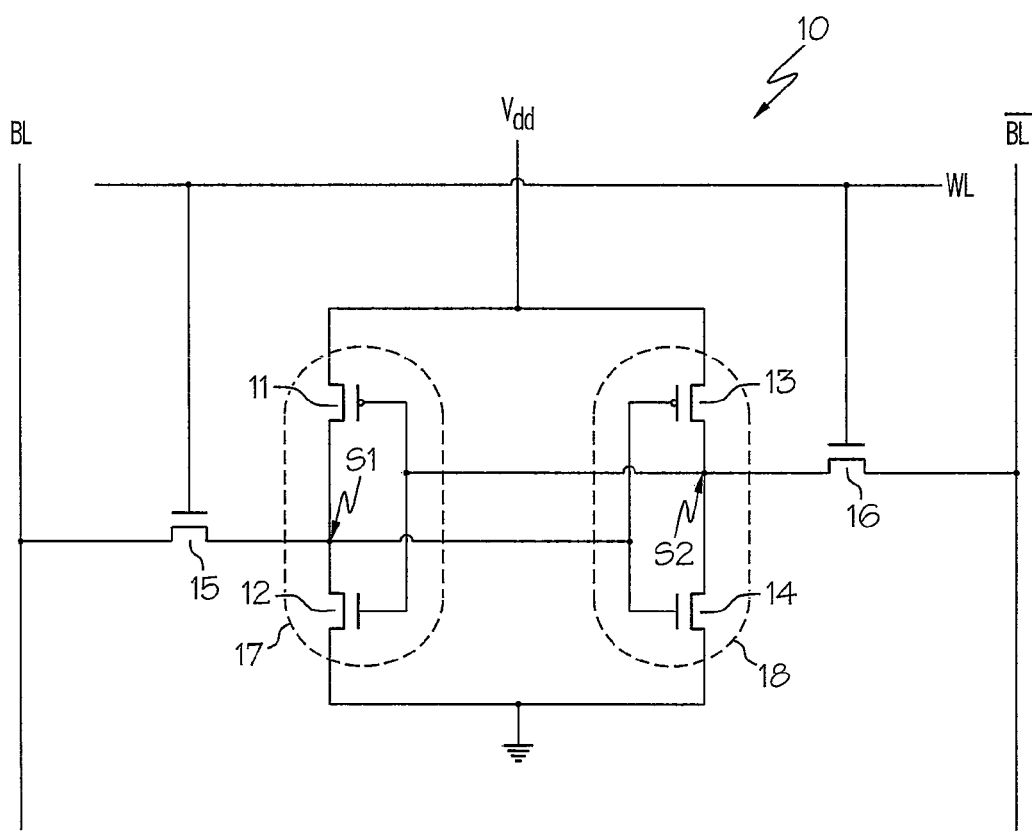
FIG. 1 is a circuit diagram of a static random access memory (SRAM) cell, according to the prior art.

Referring now to the drawings and in particular to FIG. 1, there is illustrated a circuit diagram of a static random access memory (SRAM) cell, according to the prior art. As shown, an SRAM cell 10 is formed by two cross-coupled complementary metal oxide semiconductor (CMOS) inverters 17 and 18. Inverter 17 includes a p-channel transistor 11 and an n-channel transistor 12, and inverter 18 includes a p-channel transistor 13 and an n-channel transistor 14. The gates of transistors 11 and 12 are connected to the drains of transistors 13 and 14, and the gates of transistors 13 and 14 are connected to the drains of transistors 11 and 12. This arrangement of inverter 17 and inverter 18 is commonly referred to as cross-coupled inverters, and the two lines connecting the gates and the drains of inverters 17 and 18 are commonly referred to as cross-coupling lines. An n-channel pass transistor 15, having its gate connected to a wordline WL, is coupled between a bitline BL and a node S1. Similarly, an n-channel pass transistor 16, also having its gate connected to wordline WL, is coupled between a bitline $\overline{BL}$ and a node S2. When enabled, pass transistors 15, 16 allow data to pass in and out of SRAM cell 10 from bitlines BL and $\overline{BL}$, respectively. Pass transistors 15, 16 are enabled by wordline WL, which has a state that is a function of the row address within an SRAM.

During operation, the voltages of nodes S1 and S2 are logical complements of one another, due to the cross-coupling of inverters 17 and 18. When wordline WL is energized by the row decoder according to the row address received, pass transistors 15 and 16 will be turned on, coupling nodes S1 and S2 to bit lines BL and $\overline{BL}$, respectively. Accordingly, when wordline WL is high, the state of SRAM cell 10 can establish a differential voltage on BL and $\overline{BL}$.

The logic state of SRAM cell 10 can be changed by a single event upset (SEU) in many ways. For example, if a single energetic particle, such as an alpha particle, strikes the drain of transistor 11 of inverter 17, electrons will diffuse towards a power supply $V_{dd}$ of inverter 17, and holes collected at the drain will change the output voltage of inverter 17 at node S1 from a logic low to a logic high when transistor 12 is on and transistor 11 is off. However, if the alpha particle strikes the drain of transistor 12 of inverter 17, holes will drift towards ground, and electrons collected at the drain will change the output voltage of inverter 17 at node S1 from a logic high to a logic low when transistor 11 is on and transistor 12 is off.

Figure 2A:
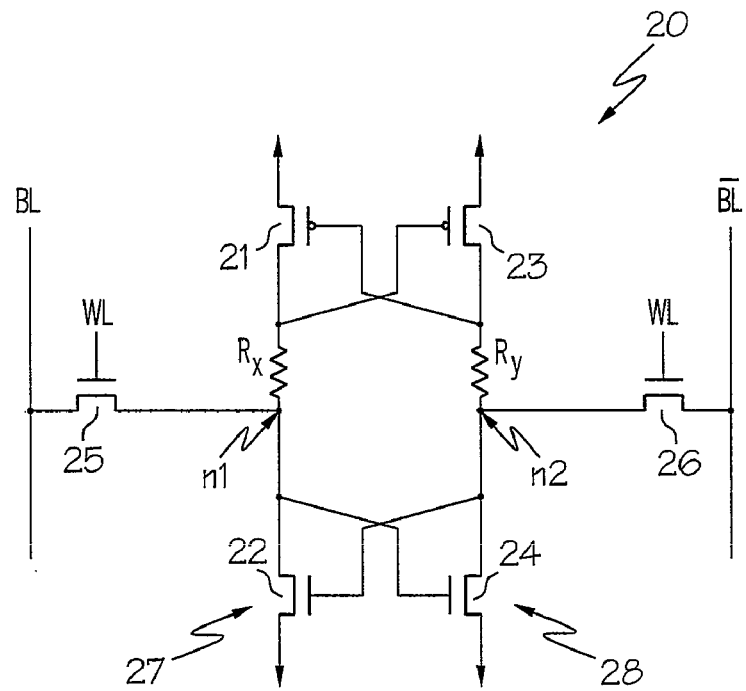
FIG. 2a is a circuit diagram of an SEU-hardened SRAM cell, in accordance with a preferred embodiment of the present invention.

With reference now to FIG. 2a, there is illustrated a circuit diagram of an SEU-hardened SRAM cell, in accordance with a preferred embodiment of the present invention. As shown, an SRAM cell 20 is formed by two cross-coupled inverters 27 and 28. Inverter 27 includes a p-channel transistor 21 and an n-channel transistor 22, and inverter 28 includes a p-channel transistor 23 and an n-channel transistor 24. An n-channel pass transistor 25, having its gate connected to a wordline WL, is coupled between a bitline BL and a node n1. Similarly, an n-channel pass transistor 26, also having its gate connected to wordline WL, is coupled between a bitline $\overline{BL}$ and a node n2. When enabled, pass transistors 25-26 allow data to pass in and out of SRAM cell 20 from bitlines BL and $\overline{BL}$, respectively.

In order to harden SRAM cell 20 from SEUs, a resistor Rx is included between transistor 21 and transistor 22, and a resistor Ry is included between transistor 23 and 24. Specifically, resistor Rx is connected between a source of transistor 21 and a drain of transistor 22 within inverter 27. Similarly, resistor Ry is connected between a source of transistor 23 and a drain of transistor 24 within inverter 28.

Figure 2B:
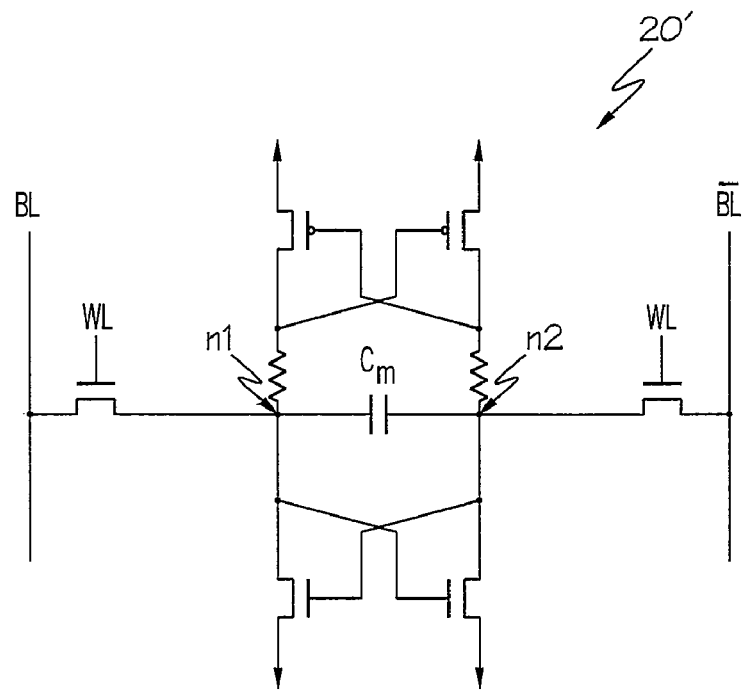
FIG. 2b is a circuit diagram of an SEU-hardened SRAM cell, in accordance with a second embodiment of the present invention.

Referring now to FIG. 2b, there is illustrated a circuit diagram of an SEU-hardened SRAM cell, in accordance with a second embodiment of the present invention. As shown, an SRAM cell 20' is similar to SRAM cell 20 from FIG. 2a. The difference between SRAM cell 20' and SRAM cell 20 is that SRAM cell 20' includes a capacitor Cm connected between node n1 and node n2.

Capacitor Cm is preferably made of metal-insulator-metal (MIM) because it occupies less physical area. However, capacitor Cm may be constructed with materials other than aluminum and a dielectric insulator. Other structures that may be used for capacitor Cm include poly-poly capacitors, trench capacitors, etc. In addition, capacitor Cm can be physically placed, for example, above transistors 21-24 in a vertical dimension in order to share the same silicon footprint with transistors 21-24.

MIM capacitor Cm provides positive feedback during an SEU event on a positively biased drain of one of transistors 22 or 24 storing a "1" in SRAM cell 20. For example, when node n1 is temporarily discharged (grounded) by an SEU event while a "0" is momentarily coupled to node n2, reinforcing or maintaining the original state of the latched circuit until recombination occurs and the transient dissipates.

Figure 2C:
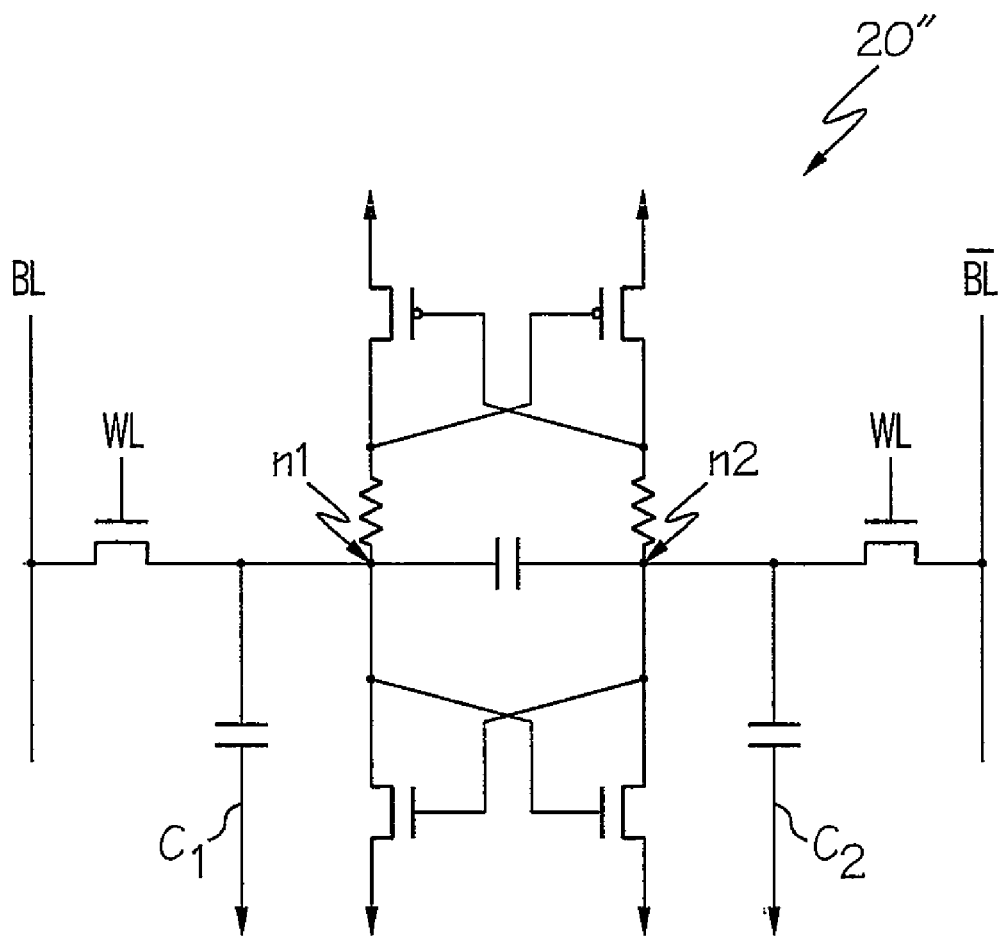
FIG. 2c is a circuit diagram of an SEU-hardened SRAM cell, in accordance with a third embodiment of the present invention.

With reference now to FIG. 2c, there is illustrated a circuit diagram of an SEU-hardened SRAM cell, in accordance with a third embodiment of the present invention. As shown, an SRAM cell 20'' is similar to SRAM cell 20' from FIG. 2b. The difference between SRAM cell 20'' and SRAM cell 20' is that SRAM cell 20'' includes two additional capacitors C1 and C2. Preferably, capacitor C1 is connected to node n1, and capacitor C2 is connected to node n2.

Figure 3:
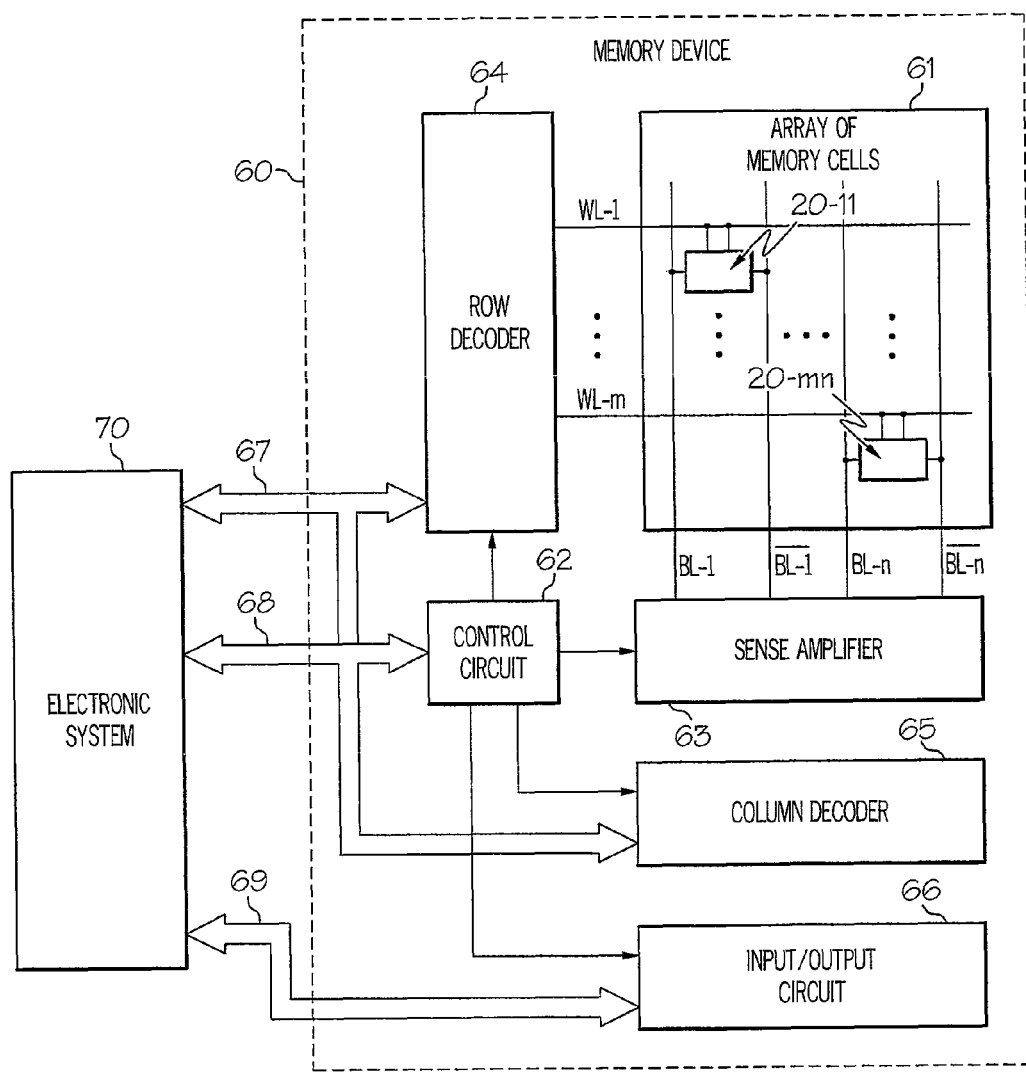
FIG. 3 is a block diagram of an apparatus in which the SEU-hardened SRAM cells from FIGS. 2a-2c may be incorporated.

As has been described, the present invention provides a SEU-hardened memory cell to be utilized in SRAMs. The present invention may be implemented in a variety of apparatuses having an SRAM. For example, referring now to FIG. 3, there is depicted a block diagram of an apparatus in which an SRAM may be incorporated. As shown, the apparatus includes an electronic system 70 coupled to a memory device 60. Electronic system 70 may be, for example, a processor, a memory controller, a chip set or any system that stores data in a memory device such as memory device 60. Electronic system 70 is coupled to a row decoder 64 and a column decoder 65 of memory device 60 via address lines 67. Electronic system 70 is also coupled to a control circuit 62 of memory device 60 via control lines 68. In addition, electronic system 70 is coupled to an input/output circuit 66 of memory device 60 via input/output lines 69.

Memory device 60 includes a sense amplifier 63 and a memory cell array 61. Array 61 includes a number of wordlines, WL-1 through WL-m, and a number of bit line pairs, BL-1 through BL-n (and $\overline{BL}$-1 through $\overline{BL}$-n). Array 61 is constructed to use a memory cell sensing scheme such that each bit line pair is to be used in reading and writing data into a SRAM cell such as SRAM cell 20-11. Memory device 60 is controlled by control circuit 62. Control circuit 62 is coupled to row decoder 64, column decoder 65, input/output circuit 66, and sense amplifier 63.

Memory device 60 reads and writes data for electronic system 70. For example, in order to read a value from SRAM cell 20-11 in a read operation, electronic system 70 provides the address of SRAM cell 20-11 to row decoder 64 over address lines 67. Electronic system 70 also provides control signals to control circuit 62 over control lines 68. Control circuit 62 provides signals to sense amplifier 63 that causes an equilibrate circuit (not shown) within sense amplifier 63 to equilibrate the voltages on bit lines BL-1 and $\overline{BL}$-1. The equilibrate circuit of sense amplifier 63 forces bit lines BL-1 and $\overline{BL}$-1 to a common voltage; for example, $V_{dd}$-$V_t$. It is noted that the voltage range between the high and low logic levels for sense amplifier 63 differs from that of SRAM cell 20-11.

With the charge on bit line pair, sense amplifier 63 next detects the logic state of SRAM cell 20-11. Column decoder 65 receives the column address of the selected cell from electronic system 70. Column decoder 65 identifies the appropriate bit line pair for sense amplifier 63 to use in reading the value from SRAM cell 20-11. Sense amplifier 63 senses and amplifies the differential voltage across the bit line pair and thus produces high and low logic levels on complementary nodes of sense amplifier 63 that correspond to the states of the sensed bit line pair. These voltage levels are passed to electronic system 70 by input/output circuit 66 via input/output lines 69.

In a write operation, electronic system 70 provides data to be written to, for example, SRAM cell 20-11 over input/output lines 69 to input/output circuit 67. Column decoder 65 receives the column address from electronic system 70 via address lines 67 to select the appropriate bit line pair for the selected SRAM cell. Sense amplifier 63, under the control of control circuit 62, forces the bit line pair for SRAM cell 20-11 to complementary high and low logic levels based on the data to be stored in SRAM cell 20-11. Row decoder 64 receives an address from electronic system 70 over address line 67 that indicates the appropriate wordline to activate for this store operation. In this process, the high and low logic levels for sense amplifier 63 are translated to appropriate voltage levels for SRAM cell 20-11.

While the invention has been particularly shown and described with reference to a preferred embodiment, it will be understood by those skilled in the art that various changes in form and detail may be made therein without departing from the spirit and scope of the invention.

What is claimed is:

1. A single event upset hardened memory cell comprising:
a first resistor and a second resistor;
a first transistor and a second transistor, wherein said first resistor is connected between a source of said first transistor and a drain of said second transistor, wherein said second resistor is connected between a gate of said first transistor and a gate of said second transistor;

a third transistor and a fourth transistor, wherein said second resistor is connected between a source of said third transistor and a drain of said fourth transistor, wherein said first resistor is connected between a gate of said third transistor and a gate of said fourth transistor; and a capacitor connected between said drain of said second transistor and said drain of said fourth transistor.

2. The memory cell of claim 1, wherein said second transistor is an n-channel transistor and said first transistor is a p-channel transistor, and said fourth transistor is an n-channel transistor and said third transistor is a p-channel transistor.

3. The memory cell of claim 1, wherein said capacitor is a metal-insulator-metal capacitor.

4. The memory cell of claim 3, wherein said metal-insulator-metal capacitor is physically located on top of said first, second, third and fourth transistors.

5. The memory cell of claim 1, wherein said memory cell further includes a second capacitor connected between said drain of said second transistor and ground.

6. The memory cell of claim 1, wherein said memory cell further includes a third capacitor connected between said drain of said fourth transistor and ground.

7. A memory device, comprising:
a sense amplifier;
an addressing circuitry having a row decoder and a column decoder;
an array of wordlines and complementary bit line pairs, coupled to said sense amplifier and said addressing circuitry;
a plurality of memory cells located at an intersection of each of said wordlines and said bitline pairs, wherein each of said plurality of memory cells has a single event upset hardened bi-stable circuit that includes:
a first resistor and a second resistor;
a first transistor and a second transistor, wherein said first resistor is connected between a source of said first transistor and a drain of said second transistor, wherein said second resistor is connected between a gate of said first transistor and a gate of said second transistor;
a third transistor and a fourth transistor, wherein said second resistor is connected between a source of said third transistor and a drain of said fourth transistor, wherein said first resistor is connected between a gate of said third transistor and a gate of said fourth transistor: and
a capacitor connected between said drain of said second transistor and said drain of said fourth transistor.

8. The memory device of claim 7, wherein said second transistor is an n-channel transistor and said first transistor is a p-channel transistor, and said fourth transistor is an n-channel transistor and said third transistor is a p-channel transistor.

9. The memory device of claim 7, wherein said capacitor is a metal-insulator-metal capacitor.

10. The memory device of claim 9, wherein said metal-insulator-metal capacitor is physically located on top of said first, second, third and fourth transistors.

11. The memory device of claim 7, wherein said memory cell further includes a second capacitor connected between said drain of said second transistor and ground.

12. The memory device of claim 7, wherein said memory cell further includes a third capacitor connected between said drain of said fourth transistor and ground.

13. An apparatus, comprising:
an electronic system; and
a memory device having a plurality of memory cells, wherein each of said plurality of memory cells has a single event upset hardened bi-stable circuit that includes:
a first resistor and a second resistor;
a first transistor and a second transistor, wherein said first resistor is connected between a source of said first transistor and a drain of said second transistor, wherein said second resistor is connected between a gate of said first transistor and a gate of said second transistor;
a third transistor and a fourth transistor, wherein said second resistor is connected between a source of said third transistor and a drain of said fourth transistor, wherein said first resistor is connected between a gate of said third transistor and a gate of said fourth transistor; and
a capacitor connected between said drain of said second transistor and said drain of said fourth transistor.

14. The apparatus of claim 13, wherein said second transistor is an n-channel transistor and said first transistor is a p-channel transistor, and said fourth transistor is an n-channel transistor and said third transistor is a p-channel transistor.

15. The apparatus of claim 13, wherein said capacitor is a metal-insulator-metal capacitor.

16. The apparatus of claim 15, wherein said metal-insulator-metal capacitor is physically located on top of said first, second, third and fourth transistors.

17. The apparatus of claim 13, wherein said memory cell further includes a second capacitor connected between said drain of said second transistor and ground, and a third capacitor connected between said drain of said fourth transistor and ground.

* * * * *